(12) United States Patent
Matsuda

(10) Patent No.: US 7,821,031 B2
(45) Date of Patent: Oct. 26, 2010

(54) SWITCH CIRCUIT, SEMICONDUCTOR DEVICE, AND METHOD OF MANUFACTURING SAID SEMICONDUCTOR DEVICE

(75) Inventor: Hajime Matsuda, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 610 days.

(21) Appl. No.: 11/391,487

(22) Filed: Mar. 29, 2006

(65) Prior Publication Data

US 2006/0219534 A1    Oct. 5, 2006

(30) Foreign Application Priority Data

Mar. 30, 2005    (JP) .............................. 2005-096903

(51) Int. Cl.
*H01L 29/739* (2006.01)
(52) U.S. Cl. ..................... 257/192; 257/20; 257/24; 257/294
(58) Field of Classification Search ................ 327/365; 257/192, 20, 24, 294
See application file for complete search history.

(56) References Cited

U.S. PATENT DOCUMENTS

| | | | | |
|---|---|---|---|---|
| 4,727,403 A | * | 2/1988 | Hida et al. | 257/194 |
| 5,945,693 A | * | 8/1999 | Suzuki et al. | 257/192 |
| 7,208,777 B1 | * | 4/2007 | Inai et al. | 257/194 |

FOREIGN PATENT DOCUMENTS

JP        8-139014 A    5/1996

* cited by examiner

*Primary Examiner*—Michael B Shingleton
(74) *Attorney, Agent, or Firm*—Westerman, Hattori, Daniels & Adrian, LLP

(57) ABSTRACT

A switch circuit includes: a first FET that is connected to one of an input terminal and an output terminal, and performs ON/OFF operation under the control of a gate electrode connected to a control terminal; and a second FET that is connected between the first FET and the other one of the input terminal and the output terminal, and performs ON/OFF operation under the control of a gate electrode connected to the control terminal. The first FET has a higher gate backward breakdown voltage than that of the second FET. Alternatively, the first FET has lower OFF capacitance than that of the second FET.

4 Claims, 14 Drawing Sheets

OFF SIDE

ON SIDE

SWITCH CIRCUIT, SEMICONDUCTOR DEVICE, AND METHOD OF MANUFACTURING SAID SEMICONDUCTOR DEVICE

BACKGROUND OF THE INVENTION

1. Field of the Invention

The present invention generally relates to a radio-frequency (RF) switch circuit, a semiconductor device, and a method of manufacturing the semiconductor device, and more particularly, to a radio-frequency switch circuit with a stacked structure having field effect transistors (FETS) connected in series, and a semiconductor device, and a method of manufacturing the semiconductor device.

2. Description of the Related Art

In recent years, multi-port RF switches (SPNTs: Single Pole N-Through; N being the number of ports) formed with field effect transistors (FETs) have been used for portable telephone terminals or the likes involving carrier signals. Those RF switches are required to characteristically have less harmonic components in relation to the fundamental waves of transmission signals. To reduce harmonic components, the linearity of the ON resistance of each FET in an ON state needs to be improved, and high power durability of each FET in an OFF state is required.

As disclosed in FIG. 1 of Japanese Unexamined Patent Publication No. 8-139014, the technique of connecting FETs in series has been used as a general method for improving the power durability in an OFF state. FIG. 1 shows an example (the prior art) of a SPDT (SP2T) as a RF switch in which five FETs are connected in series. A switch circuit (1)50, a switch circuit (2)60, and a resistor 71 are connected to a RF input terminal 70, and the RF input terminal 70 is grounded via the resistor 71. FETs 51, 52, 53, 54, and 55 of the switch circuit (1)50 have sources and drains connected in series, while the source of the FET 51 is connected to the input terminal 70 and the drain of the FET 55 is connected to an output terminal (1)72. The gates of the five FETs are connected to a control terminal (1)74 via resistors Rgg 58. FETs 61, 62, 63, 64, and 65 of the switch circuit (2)60 are connected in series, while the source of the FET 61 is connected to the input terminal 70 and the drain of the FET 65 is connected to an output terminal (2)76. The gates of the five FETs are connected to a control terminal (2)78 via resistors Rgg 68.

When the switch circuit (1)50 is in an OFF state, a negative voltage is applied to the control terminal (1)74, so that the FETs 51, 52, 53, 54, and 55 are put into an OFF state. Accordingly, the input terminal 70 and the output terminal (1)72 are electrically cut off from each other. When the switch circuit (2)60 is in an ON state, a positive voltage is applied to the control terminal (2)78, and the FETs 61, 62, 63, 64, and 65 are put into an ON state. Accordingly, a RF signal that is input through the input terminal 70 passes through the switch circuit (2)60, and is output to the output terminal (2)76.

FIGS. 2A and 2B show the gate current (Ig)-gate voltage (Vg) characteristics of each FET of the switch circuit in an OFF state, and the drain current (Ids)-drain voltage (Vds) characteristics of each FET of the switch circuit in an ON state.

In FIG. 2A, to increase the power durability in the OFF state, the reverse gate withstand voltage (Vgdo) should preferably be high in relation to the power amplitude of a RF signal (the RF amplitude), and the reverse gate current should preferably be in proximity to zero. When the switch circuit (1)50 is in an OFF state, the RF amplitude to be added to each of the FETs 51, 52, 53, 54, and 55 should ideally be ⅕ of the RF amplitude of an input signal. This is because the FETs are connected in series, and the power applied between the input terminal 70 and the output terminal (1)72 is evenly divided. Ideally, five FETs should be connected in series, so as to obtain power durability five times as large as the power durability of a single FET.

In a RF switch, reducing the insertion loss is also crucial. The insertion loss increases as the ON resistance (Ron) becomes higher. In FIG. 2B, the slope representing Ids-Vds in an ON state should preferably be steep, or Ron should preferably be low. Where FETs are connected in series, however, Ron becomes high, and the insertion loss increases. For example, when the switch circuit (2)60 is in an ON state, Ron of the switch circuit (2)60 is the total sum of Ron of the FETs 61, 62, 63, 64, and 65. As the number of FETs connected in series is increased so as to reduce the harmonic components, the insertion loss increases.

Meanwhile, if the power durability is increased by increasing Vgdo of the FETs forming the RF switch, Ron becomes higher. FIGS. 3 and 4 are schematic views illustrating this problem. In each of the FETs shown in FIGS. 3 and 4, a channel layer 14a and a surface layer 27a or 27b are stacked on a semiconductor substrate 10. A source electrode 30, a gate electrode 32, and a drain electrode 34 are formed on the surface layer 27a or 27b. An $n^+$-region 25 is formed below each of the source electrode 30 and the drain electrode 34. In the FET shown in FIG. 3, a depletion layer 28a is formed on the semiconductor surface. To increase Vgdo of the FET shown in FIG. 3, part of the surface layer 27a is removed, and a gate recess that is formed in the surface layer 27b shown in FIG. 4 is formed. By doing so, the depletion layer 28b becomes closer to the channel layer 14a, and Vgdo can be increased. However, the influence of the depletion layer 28b reaches the channel layer 14a, and Ron becomes higher. In this manner, when Vgdo is increased, Ron becomes higher. When the harmonic components of the RF switch are reduced by improving the FETs of the RF switch, the insertion loss increases. In the prior art, it is difficult to reduce both the harmonic components and the insertion loss.

SUMMARY OF THE INVENTION

It is therefore an object of the present invention to provide a switch circuit, a semiconductor device, and a method of manufacturing the semiconductor device in which the above disadvantage is eliminated.

A more specific object of the present invention is to provide a switch circuit with less harmonic components and lower insertion loss, a semiconductor device with less harmonic components and lower insertion loss, and a method of manufacturing such a semiconductor device.

According to one aspect of the present invention, preferably, there is provided a switch circuit including: a first FET that is connected to one of an input terminal and an output terminal, and performs ON/OFF operation under the control of a gate electrode connected to a control terminal; and a second FET that is connected between the first FET and the other one of the input terminal and the output terminal, and performs ON/OFF operation under the control of a gate electrode connected to the control terminal, the first FET having a higher gate backward breakdown voltage than that of the second FET. In accordance with the present invention, Vgdo of the first-stage FET to which a signal with large RF amplitude is input is high. Accordingly, a switch circuit with less harmonic components can be provided.

According to another aspect of the present invention, preferably, there is provided a switch circuit including: a first FET that is connected to one of an input terminal and an output terminal, and performs ON/OFF operation under the control of a gate electrode connected to a control terminal; and a second FET that is connected between the first FET and the other one of the input terminal and the output terminal, and performs ON/OFF operation under the control of a gate electrode connected to the control terminal, the first FET having lower OFF capacitance than that of the second FET. In accordance with the present invention, Coff of the first-stage FET to which a signal with large RF amplitude is input is low. Accordingly, a switch circuit with less harmonic components can be provided.

According to another aspect of the present invention, preferably, there is provided a semiconductor device including: a first FET that is connected to one of an input terminal and an output terminal, and performs ON/OFF operation under the control of a gate electrode connected to a control terminal; and a second FET that is connected between the first FET and the other one of the input terminal and the output terminal, and performs ON/OFF operation under the control of a gate electrode connected to the control terminal, a part of the gate electrode being embedded in an embedding layer in each of the first FET and the second FET, an embedded thickness of the part of the gate electrode embedded in the embedding layer of the first FET being smaller than an embedded thickness of the part of the gate electrode embedded in the embedding layer of the second FET. In accordance with the present invention, a semiconductor device with less harmonic components can be provided, as Vgdo of the first-stage FET to which a signal with large amplitude is input is higher, or Coff of the first-stage FET is lower, or Vgdo is higher and Coff is lower.

According to another aspect of the present invention, preferably, there is provided a semiconductor device including: a first FET that is connected to one of an input terminal and an output terminal, and performs ON/OFF operation under the control of a gate electrode connected to a control terminal; and a second FET that is connected between the first FET and the other one of the input terminal and the output terminal, and performs ON/OFF operation under the control of a gate electrode connected to the control terminal, the first FET and the second FET each having semiconductor layer surfaces covered with silicon nitride film between the gate electrode and a source electrode and between the gate electrode and a drain electrode, the silicon nitride film in the first FET having a lower nitrogen composition ratio than a nitrogen composition ratio of the silicon nitride film in the second FET. In accordance with the present invention, a semiconductor device with less harmonic components can be provided, as Vgdo of the first-stage FET to which a signal with large amplitude is input is higher, or Coff of the first-stage FET is lower, or Vgdo is higher and Coff is lower.

According to another aspect of the present invention, preferably, there is provided a semiconductor device including: a first FET that is connected to one of an input terminal and an output terminal, and performs ON/OFF operation under the control of a gate electrode connected to a control terminal; and a second FET that is connected between the first FET and the other one of the input terminal and the output terminal, and performs ON/OFF operation under the control of a gate electrode connected to the control terminal, the first FET and the second FET each having the gate electrode in a gate recess, a gate recess width in the first FET being larger than a gate recess width in the second FET. In accordance with the present invention, a semiconductor device with less harmonic components can be provided, as Vgdo of the first-stage FET to which a signal With large amplitude is input is higher, or Coff of the first-stage FET is lower, or Vgdo is higher and Coff is lower.

According to another aspect of the present invention, preferably, there is provided a method of manufacturing a semiconductor device that includes: a first FET that is connected to one of an input terminal and an output terminal, and performs ON/OFF operation under the control of a gate electrode connected to a control terminal; and a second FET that is connected between the first FET and the other one of the input terminal and the output terminal, and performs ON/OFF operation under the control of a gate electrode connected to the control terminal, the method including the steps of: forming an embedding layer on a Schottky layer on which the gate electrode is provided; selectively reducing the thickness of a portion of the embedding layer at which the gate electrode of the first FET is to be formed, by exposing the portion of the embedding layer at which the gate electrode of the first FET is to be formed and then covering a portion of the embedding layer at which the gate electrode of the second FET is to be formed with a mask layer; forming openings to expose the Schottky layer through the portions of the embedding layer at which the gate electrodes of the first. FET and the second FET are to be formed; and forming the gate electrodes in the openings. In accordance with the present invention, a method of manufacturing a semiconductor device with less harmonic components can be provided, as Vgdo of the first-stage FET to which a signal with large amplitude is input is higher, or Coff of the first-stage FET is lower, or Vgdo is higher and Coff is lower.

According to another aspect of the present invention, preferably, there is provided a method of manufacturing a semiconductor device that includes: a first FET that is connected to one of an input terminal and an output terminal, and performs ON/OFF operation under the control of a gate electrode connected to a control terminal; and a second FET that is connected between the first FET and the other one of the input terminal and the output terminal, and performs ON/OFF operation under the control of a gate electrode connected to the control terminal, the method including the steps of: forming a first silicon nitride film on a semiconductor layer; selectively removing the first silicon nitride film while leaving portions of the first silicon nitride film in regions to be located between the gate electrode and a source electrode and between the gate electrode and a drain electrode of the first FET and in regions to be located between the gate electrode and a source electrode and between the gate electrode and a drain electrode of the second FET; and forming a second silicon nitride film in the regions to be located between the gate electrode and the source electrode and between the gate electrode and the drain electrode of the first FET on the semiconductor layer, the second silicon nitride film having a lower nitrogen composition ratio than that of the first silicon nitride film. In accordance with the present invention, a method of manufacturing a semiconductor device with less harmonic components can be provided, as Vgdo of the first-stage FET to which a signal with large amplitude is input is higher, or Coff of the first-stage FET is lower, or Vgdo is higher and Coff is lower.

As described above, the present invention can provide a switch circuit that has less harmonic components and low insertion loss by increasing Vgdo of the first-stage FET to which a signal with large RF amplitude is input or reducing Coff of the first-stage FET. The present invention can also provide a semiconductor device with the same characteristics as above and a method of manufacturing such a semiconductor device.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
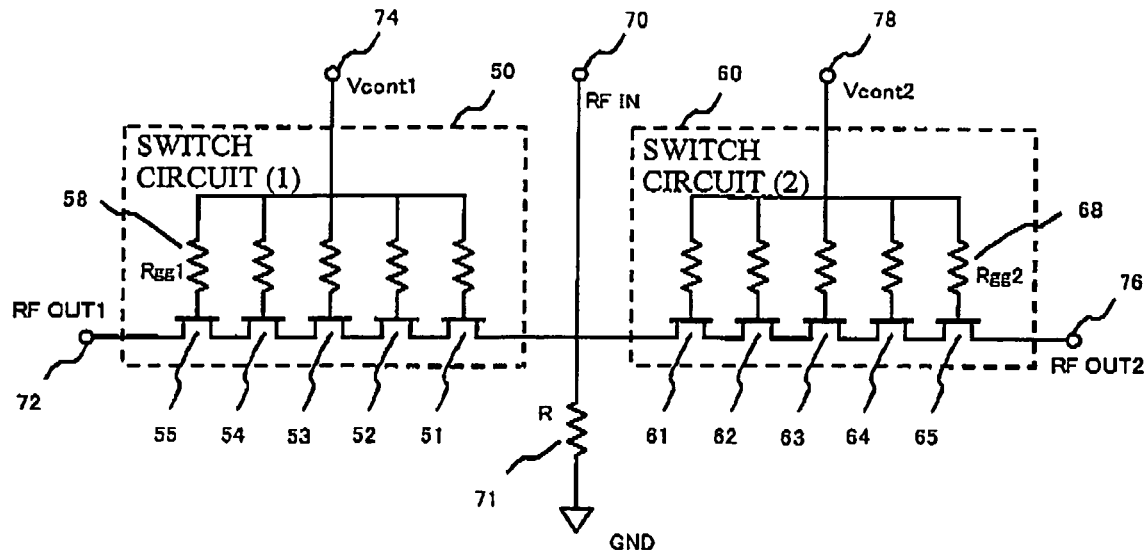
FIG. 1 illustrates the circuit structure of a conventional. RF switch.
Figure 2A:
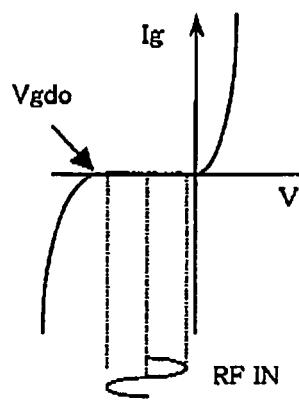
FIG. 2A shows the gate current (Ig)-gate voltage (Vg) characteristics of an FET in a switch circuit in an OFF state.
Figure 2B:
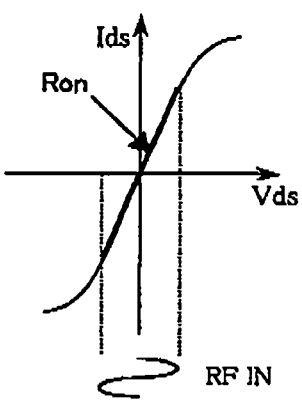
FIG. 2B shows the drain current (Ids)-drain voltage (Vds) characteristics of an FET in a switch circuit in an ON state.

Based on the conventional understanding, when the switch circuit (1)50 shown in FIG. 1 is in an OFF state, the RF amplitude that is input through the input terminal 70 should be evenly added to the FETs 51, 52, 53, 54, and 55. However, the inventor discovered that, in practice, the RF amplitude added to the first-stage FET 51 is the largest, and the RF amplitude added to the fifth-stage FET 55 is the smallest.

Figure 5:
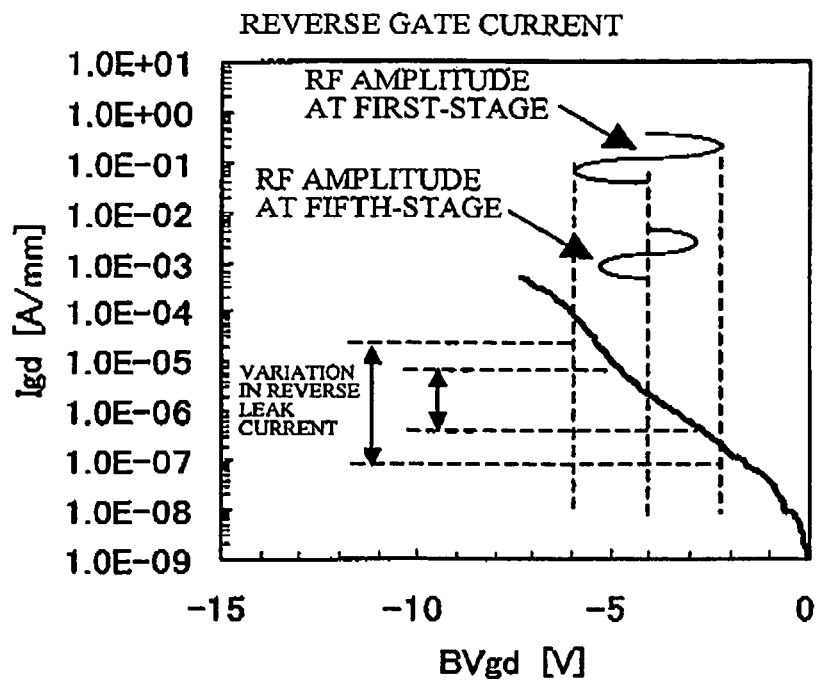
FIG. 5 shows the reverse gate current (Igd)-reverse gate voltage (BVgd) characteristics of a switch circuit.

FIG. 5 shows the reverse gate current (Igd)-reverse gate voltage (BVgd) characteristics of the first-stage FET of the switch circuit (1)50. The RF amplitude of the first-stage FET 51 is larger than the RF amplitude of the fifth-stage FET 55, and has a wider variation in reverse gate current (Igd). When the reverse gate current increases in the first-stage FET 51, the RF signal leaks through the switch circuit (1)50 in an OFF state, and the RF signal is distorted, resulting in an increase of harmonic components.

Therefore, in the present invention, the first-stage FET (the first FET) has high Vgdo, so as to reduce the reverse gate current of the first-stage FET to which the largest RF amplitude is added. Also, the other FETs (the second FETs) have lower Vgdo and lower Ron. Accordingly, the increase in Ron of the entire switch circuit can be made smaller than in the case where all the FETs have high Vgdo. Thus, a switch circuit with large power durability and lower Ron, which is a switch circuit with reduced harmonic components and low insertion loss, can be obtained.

First Embodiment

A first embodiment of the present invention is an example of a REF switch using so-called HEMTs (high Electron Mobility Transistors), or an example of SPDTs each having FETs series-connected in five stages. The HEMT has excellent low-noise characteristics with two-dimensional electron gas, having an electron supply layer and a channel layer.

Figure 6:
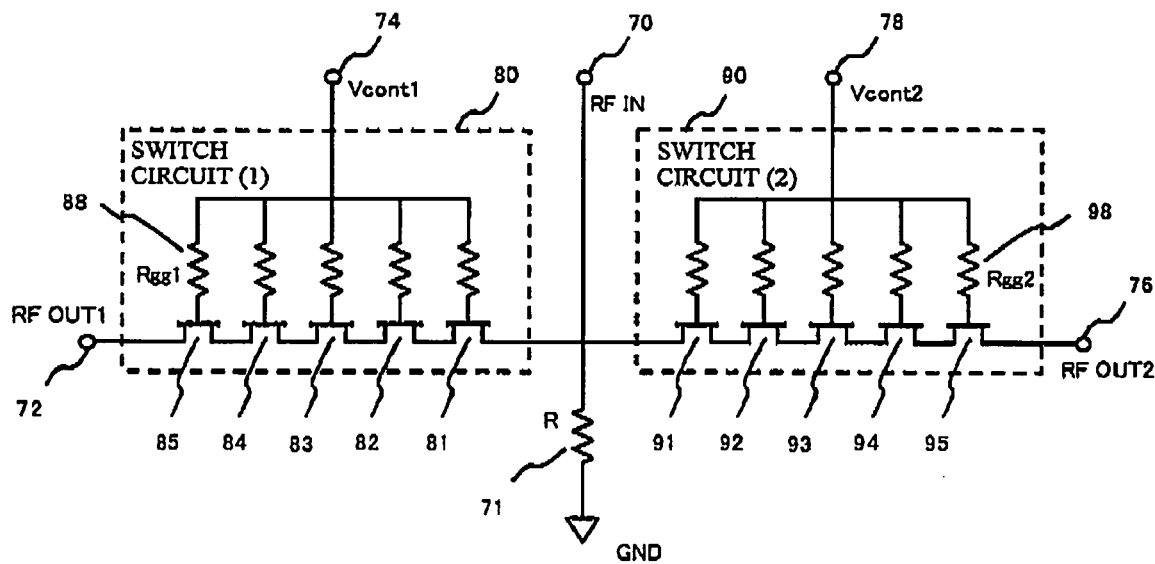
FIG. 6 illustrates the circuit structure of a RF switch in accordance with a first embodiment of the present invention.

FIG. 6 illustrates the circuit structure of the first embodiment. A switch circuit (1)80, a switch circuit (2)90, and a resistor 71 are connected to a RF input terminal 70 that is grounded via a resistor 71. In the switch circuit (1)80, the first-stage FET (the first FET) 81 has a source connected to the input terminal 70, and has a gate connected to a control terminal (1)74 via a resistor Rgg 88. The second-stage FET (the second FET) 82 has a source connected to the drain of the first-stage FET (the first FET) 81, and has a gate connected to the control terminal (1)74 via the resistor Rgg 88. The third-stage and fourth-stage FETs (the second FET) 83 and 84 each have a source and a drain connected in series, and have a gate connected to the control terminal (1)74 via the resistor Rgg 88. The fifth-stage FET (the third FET) 85 has a source connected to the drain of the fourth-stage FET (the second FET) 84, has a gate connected to the control terminal (1)74 via the resistor Rgg 88, and has a drain connected to an output terminal (72).

In this structure, the switch circuit (1)80 includes the first FET 81 that is connected to one of the input terminal 70 and the output terminal 72 and is energized or unenergized under the control of a gate electrode connected to the control terminal (1)74, and the second FET 82 that is connected between the other one of the input terminal 70 and the output terminal 72 and is energized or unenergized under the control of the gate electrode connected to the control terminal (1)74. Here, "being connected to one of the input terminal 70 and the output terminal 72" means "the source or the drain (the source in the first embodiment) of the first FET 81 being connected to either the input terminal 70 or the output terminal 72 (the input terminal 70 in the first embodiment)". Also, "being connected between the other one of the input terminal 70 and the output terminal 72" means "the source or the drain (the drain in the first embodiment) of the second FET 82 being connected to the input terminal 70 or the output terminal 72 (the output terminal 72 in the first embodiment), whichever is not connected to the source or the drain of the first FET 81, and the source or the drain (the source in the first embodiment) of the second FET 82 being connected to the source or the drain (the drain in the first embodiment) of the first FET 81, whichever is not connected to the input terminal 70".

The switch circuit (1)80 also includes the third FET 85 that is connected to the other one of the input terminal 70 and the output terminal 72 and is energized or unenergized under the control of the gate electrode connected to the control terminal (1)74. Further, the second FETs 82, 83, and 84 are connected in series between the first FET 81 and the other one of the input terminal 70 and the output terminal 72. Here, "being connected to the other one of the input terminal 70 and the output terminal 72" means "the source or the drain (the drain in the first embodiment) of the third FET 85 being connected to the input terminal 70 or the output terminal 72 (the output terminal 72 in the first embodiment), whichever is not connected to the source or the drain of the first FET 81, and the source or the drain (the source in the first embodiment) of the third FET 85 being connected to the source or the drain (the drain in the first embodiment) of the second FET 84, whichever is not connected to the first FET 81". Also, the "gate electrode" is the "gate".

Likewise, in the switch circuit (2)90, the sources and the drains of the first-stage FET (the first FET) 91, the second- to fourth-stage FETs (the second FETs) 92, 93, and 94, and the fifth-stage FET (the third FET) 95 are connected in series. Also, the source of the first-stage FET (the first FET) 91 is connected to the input terminal 70, and the drain of the fifth-stage FET (the third FET) 95 is connected to an output terminal (2)76. The gates of the FETs 91, 92, 93, 94, and 95 are connected to a control terminal (2)78 via a resistor Rgg 98.

When the switch circuit (1)80 is in an OFF state, a negative voltage is applied to the control terminal (1)74, and the FETs 81, 82, 83, 84, and 85 are put into an OFF state. As a result, the input terminal 70 and the output terminal (1)72 are electrically cut off from each other. When the switch circuit (2)90 is in an ON state, a positive voltage is applied to the control terminal (2)78, and the FETs 91, 92, 93, 94, and 95 are put into an ON state. As a result, a RF signal that is input through the input terminal 70 passes through the switch circuit (2)90, and is output to the output terminal (2)76. Here, "being energized or unenergized under the control of the gate electrode connected to the control terminal" means "the FETs being electrically cut off or a RF signal being cut off when a negative voltage is applied to the control terminal 74, and a RF signal passing through the FETs when a positive voltage is applied to the control terminal 78".

Figure 7:
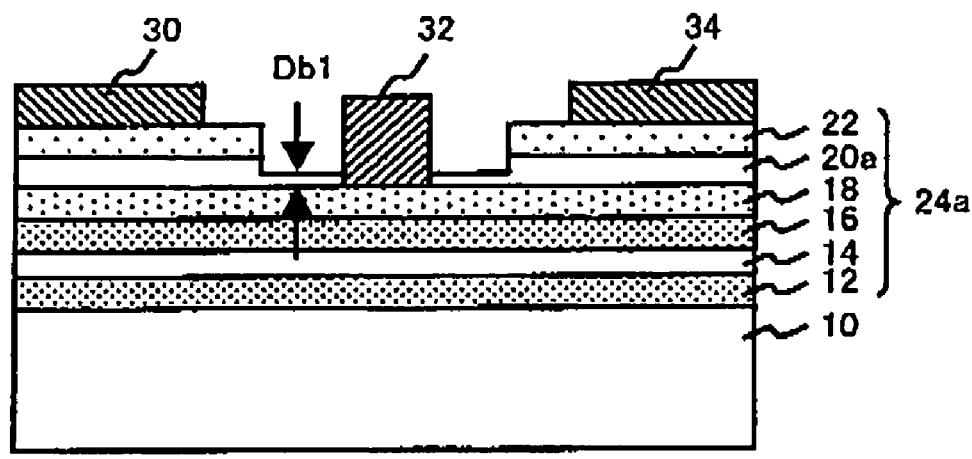
FIG. 7 is a cross-sectional view of one of the first-stage and fifth-stage FETs of the switch circuit in accordance with the first embodiment.
Figure 8:
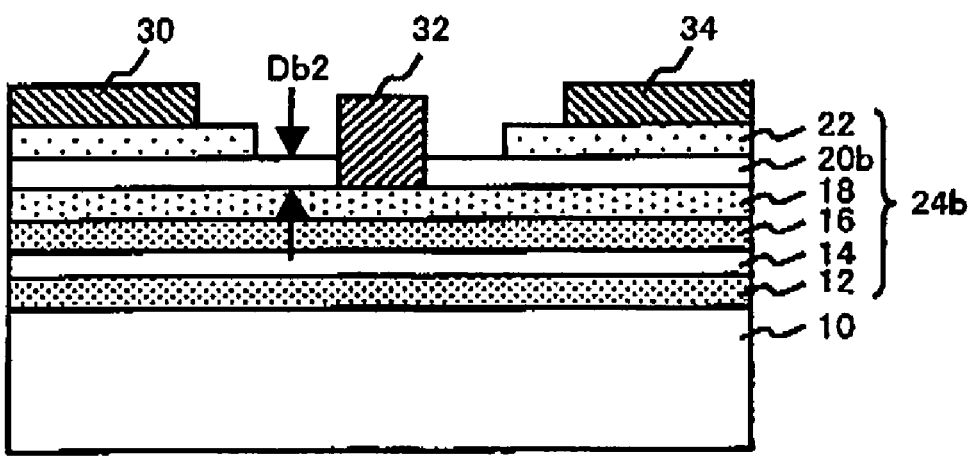
FIG. 8 is a cross-sectional view of one of the second- to fourth-stage FETs of the switch circuit in accordance with the first embodiment.

FIGS. 7 and 8 are cross-sectional views of the FETs employed in the RF switch in accordance with the first embodiment. FIG. 7 is a cross sectional view of the first-stage FETs (the first FETs) 81 and 91 and the fifth-stage FETs (the third FETs) 85 and 95. FIG. 8 is a cross sectional view of the second- to fourth-stage FETs (the second FETs) 82, 83, 84, 92, 93, and 94. In the HEMTs illustrated in FIGS. 7 and 8, electron supply layers 12 and 16 are provided on and below a channel layer 14, and two-dimensional electron gas is generated above and below the channel layer 14. Since a high drain current can be maintained, these HEMTs are suitable for a switch circuit. The FETs of the present invention may be compound semiconductors containing GaAs and AlGaAs, or the likes. In the first embodiment, the HEMTs contain GaAs, InGaAs, and AlGaAs, or the likes. In the present invention, a "GaAs-based compound semiconductor" contains GaAs, AlGaAs, and InGaAs, for example.

As shown in FIGS. 7 and 8, an n-type AlGaAs electron supply layer 12 with silicon, an InGaAs channel layer 14 with no impurities, an n-type AlGaAs electron supply layer 16 with silicon, an AlGaAs Schottky layer 18 with no impurities, a GaAs embedding layer 20$a$ or 20$b$ with no impurities, and an n-type GaAs high-concentration layer 22 with silicon are formed as a semiconductor layer 24$a$ or 24$b$ on a GaAs semiconductor substrate via a buffer layer (not shown) by MOCVD, for example. A source electrode 30 and a drain electrode 34 are formed on the high-concentration layer 22. The portion of the high-concentration layer 22 between the source electrode 30 and the drain electrode 34 is removed so as to form a gate recess. The portion of the embedding layer 20$a$ or 20$b$ located below the gate electrode 32 is removed, so that the gate electrode 32 is embedded in the embedding layer 20$a$ or 20$b$. Here, the "embedded thickness" is the thickness of the portion of the gate electrode 32 embedded in the semiconductor layer 24$a$ or 24$b$.

Each of the above described HEMTs is manufactured in the following manner. First, the buffer layer (not shown), the electron supply layer 12, the channel layer 14, the electron supply layer 16, the Schottky layer 18, the GaAs embedding layer 20$a$ or 20$b$, and the high-concentration layer 22 are grown on the GaAs substrate 10 by MOCVD, for example. Next, the portion of the high-concentration layer 22 at which the gate electrode 32 of each FET is to be formed is selectively removed so as to expose the embedding layer 20$a$ or 20$b$. The portions of the embedding layer 20$a$ at which the first-stage FET (the first FET) 81 or 91 and the fifth-stage FET (the third FET) 85 or 95 are to be formed are exposed. A mask layer made of photoresist or the like is then formed to cover the portions of the embedding layer 20$b$ at which the second- to fourth-stage FETs (the second FETs) 82, 83, 84, 92, 93, and 94 are to be formed. Using the mask layer, the exposed portions of the embedding layer 20$a$ are etched so as to form concave portions. After an opening to expose the Schottky layer 18 is formed at the portion of the embedding layer 20$a$ or 20$b$ at which the gate electrode 32 of each FET is to be formed, the gate electrode 32 is formed there. Lastly, the source electrode 30 and the drain electrode 34 are formed on the high-concentration layer 22 of each FET, thereby completing each of the HEMTs illustrated in FIGS. 7 and 8.

In FIG. 7, the gate recess is formed midway in the embedding layer 20$a$, and the gate electrode 32 is embedded in the rest of the embedding layer 20$a$. The embedded thickness at this point is set as Db1. In FIG. 8, the gate recess reaches only the surface of the embedding layer 20$b$, and the gate electrode 32 is embedded in the embedding layer 20$b$. The embedded thickness in this case is set as Db2. In the first embodiment, Db1 is smaller than Db2, and more specifically, Db1 is 20 nm while Db2 is 35 nm. The embedded thickness Db1 of the gate of each of the first-stage FETs (the first FETs) 81 and 91 and the fifth-stage FETs (the third FETs) 85 and 95 is smaller than the embedded thickness Db2 of the gate of each of the second- to fourth-stage FETs (the second FETs) 82, 83, 84, 92, 93, and 94. In this structure, the gate electrode 32 of each of the first-stage FETs (the first FETs) 81 and 91, the fifth-stage FETs (the third FETs) 85 and 95, and the second- to fourth-stage FETs (the second FETs) 82, 83, 84, 92, 93, and 94 is embedded in the embedding layer 20a or 20b, and the embedded thickness Db1 in the embedding layer of the first-stage FET (the first FET) 81 is smaller than the embedded thickness Db2 in the embedding layer of each of the second FETs.

Figure 9:
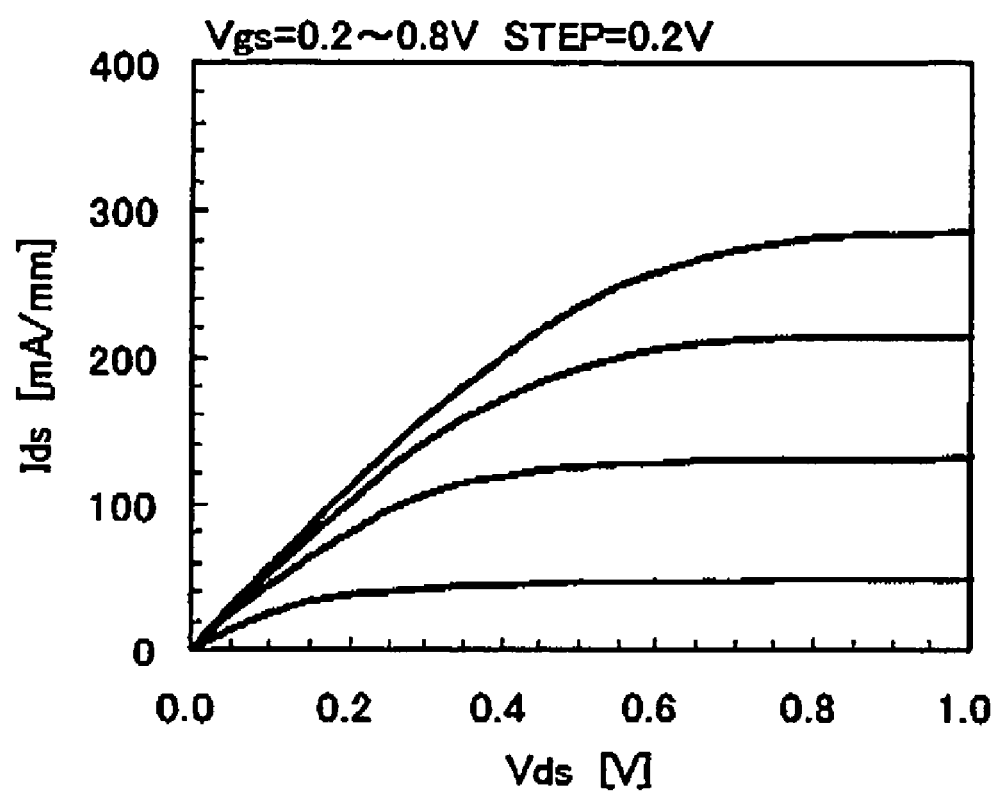
FIG. 9 shows the drain current (Ids)-drain voltage (Vds) characteristics of each of the first-stage and fifth-stage FETs (with an embedded thickness of 20 nm) of the switch circuit in accordance with the first embodiment.
Figure 10:
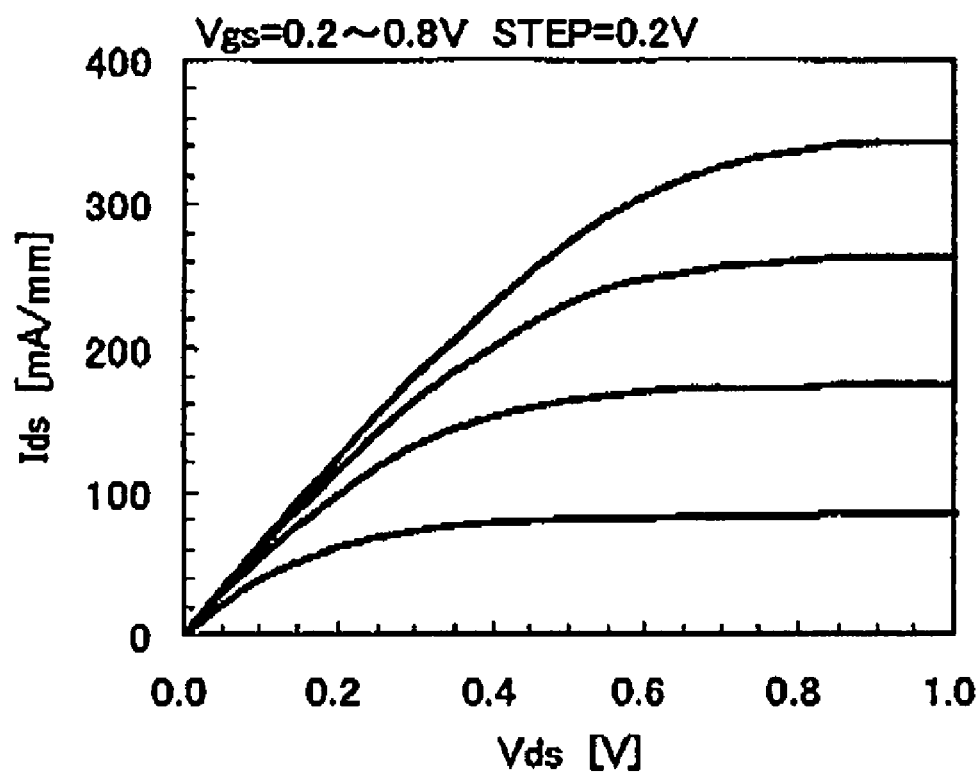
FIG. 10 shows the drain current (Ids)-drain voltage (Vds) characteristics of each of the second- to fourth-stage FETs (with an embedded thickness of 35 nm) of the switch circuit in accordance with the first embodiment.
Figure 11:
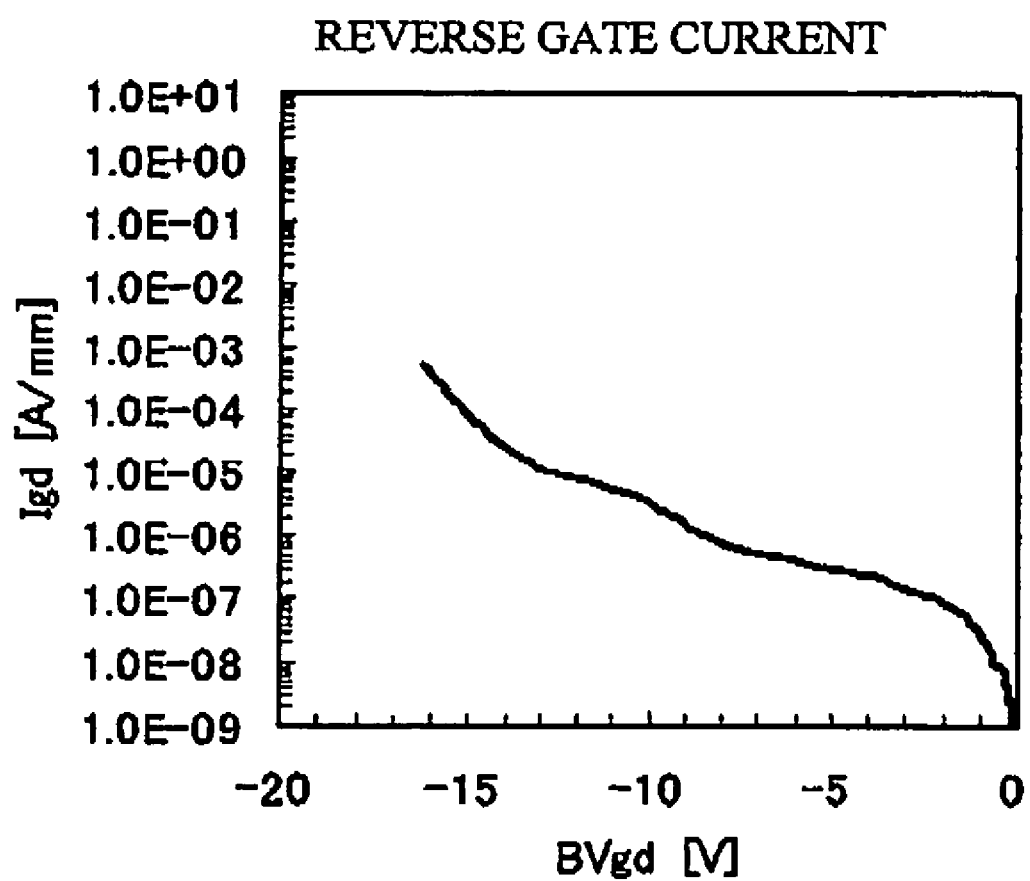
FIG. 11 shows the reverse gate current (Igd)-reverse gate voltage (BVgd) characteristics of each of the first-stage and fifth-stage FETs (with an embedded thickness of 20 nm) of the switch circuit in accordance with the first embodiment.
Figure 12:
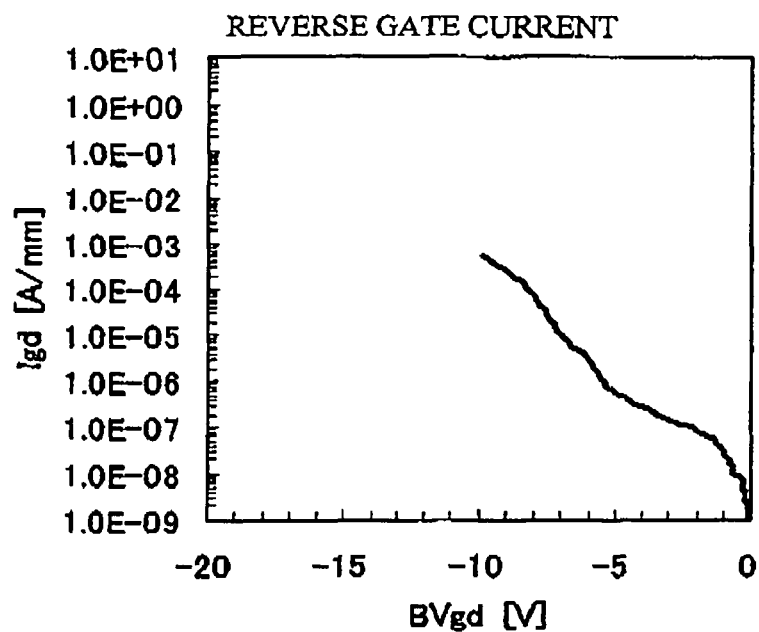
FIG. 12 shows the reverse gate current (Igd)-reverse gate voltage (BVgd) characteristics of each of the second- to fourth-stage FETs (with an embedded thickness of 35 nm) of the switch circuit in accordance with the first embodiment.

FIGS. 9 and 10 show the drain current (Ids)-drain voltage (Vds) characteristics of a FET with an embedded thickness of 20 nm and a FET with an embedded thickness of 35 nm, respectively. In FIGS. 9 and 10, the slope representing the drain current Ids with respect to the drain voltage Vds of the FET with the embedded thickness of 20 nm is gentler than the slope representing the drain current Ids with respect to the drain voltage Vds of the FET with the embedded thickness of 35 n. FIGS. 11 and 12 show the reverse gate current (Igd)-reverse gate voltage (BVgd) characteristics of the FET with the embedded thickness of 20 nm and the FET with the embedded thickness of 35 nm, respectively. The reverse gate current of the FET with the embedded thickness of 20 nm is lower than that of the FET with the embedded thickness of 35 nm.

Table 1 shows Ron and Vgdo per 1 mm in gate width of each of the FETs with different embedded thicknesses.

In the FET with the embedded thickness of 20 nm, Ron is 1.93 Ωmm, which is higher than Ron of 1.73 Ωmm in the FET with the embedded thickness of 35 nm. In the FET with the embedded thickness of 20 nm, Vgdo is −16.2 V, which is much better than Vgdo of −9.8 V in the FET with the embedded thickness of 35 nm.

TABLE 1

| Embedded thickness | Ron (Ω mm) | Vgdo (V) |
|---|---|---|
| 35 nm | 1.73 | −9.8 |
| 20 nm | 1.93 | −16.2 |

In the first embodiment, Vgdo of each of the first-stage FETs (the first FETs) 81 and 91 and the fifth-stage FETs (the third FETs) 85 and 95 can be made higher than Vgdo of each of the second- to fourth-stage FETs (the second FETs) 82, 83, 84, 92, 93, and 94. Also, Ron of each of the second- to fourth-stage FETs (the second FETs) 82, 83, 84, 92, 93, and 94 can be made lower than Ron of each of the first-stage FETs (the first FETS) 81 and 91 and the fifth-stage FETs (the third FETs) 85 and 95.

Since the reverse gate current is low and Vgdo is high in each of the first-stage FETs (the first FETs) 81 and 91 that exhibit larger RF amplitude than the other FETs, the variation in reverse gate current can be made smaller. and excellent power durability can be obtained even if a signal with large RF amplitude is input.

Figure 13:
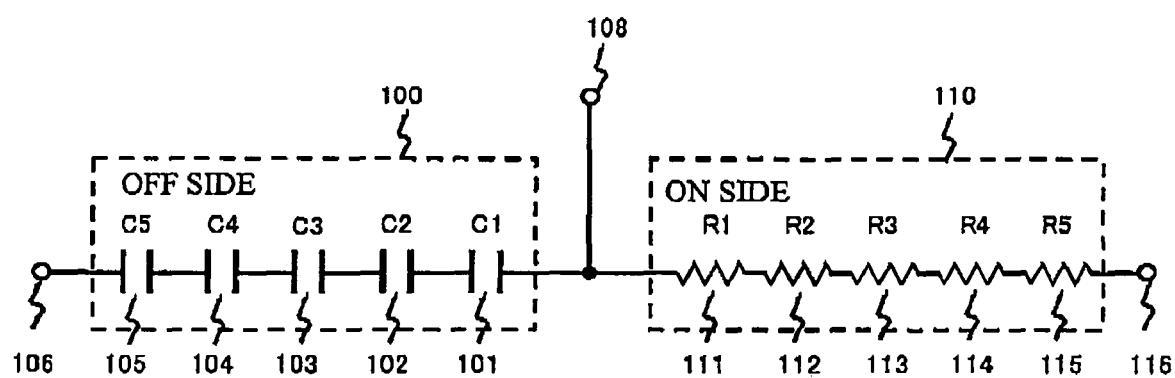
FIG. 13 is a simplified circuit diagram of the SPDT circuit in which five FETs are connected in series in accordance with the first embodiment.

The circuit of a five-stage series-connected SPDT can be simply drawn as shown in FIG. 13. In a switch circuit 100 in an OFF state, capacitors 101, 102, 103, 104, and 105 are connected in series. In a switch circuit 110, resistors 111, 112, 113, 114, and 115 are connected in series. In the switch circuit 100 in an OFF state, the OFF capacitance Coff is crucial, and in the switch circuit 110 in an ON state, Ron is crucial.

In the first embodiment, each of the first-stage FETs (the first FETs) 81 and 91 and the fifth-stage FETs (the third FETs) 85 and 95 has an embedded thickness of 20 nm, and each of the other FETs (the second FETs) 82, 83, 84, 92, 93, and 94 has an embedded thickness of 35 nm. Here, Ron of the entire switch circuit (1) with a gate width of 2.4 mm is calculated to find the following: 1.73 Ωmm=/2.8 mm×3+1.93 Ωmm/2.8 mm×2=3.23 Ω. In the case where all the five-stage FETs have an embedded thickness of 35 nm or 20 nm, the following is obtained: 1.73 Ωmm=/2.8 mm×5=3.09 Ω, 1.93 Ωmm/2.8 mm×5=3.45 Ω.

If all the five-stage FETs have an embedded thickness of 20 nm, Ron of the entire switch circuit is approximately 12% higher than that in the case where all the five-stage FETs have an embedded thickness of 35 nm. In the first embodiment, however, the Ron increase is restricted to approximately 5%, compared with the case where all the FETs have an embedded thickness of 35 nm. As the first-stage FETs (the first FETs) 81 and 91 and the fifth-stage FETs (the third FETs) 85 and 95 with the larger RF amplitude have a larger embedded thickness, the Ron increase is reduced, and the reverse gate current is restricted even if a signal with large RF amplitude is input. Thus, a switch signal with excellent power durability can be obtained.

Table 2 shows Cgs, Cgd, Cds, and Coff of FETs with embedded thicknesses of 35 nm and 20 nm. Here, Coff is calculated according to Equation 1, after Cgs, Cgd, and Cds of the equivalent circuit are determined from S-parameters. As shown in Table 2, Coff of the FET with the embedded thickness of 20 nm is 0.281 pF/mm, and Coff of the FET with the embedded thickness of 35 nm is 0.299 pF/mm. Accordingly, Coff of the FET with the embedded thickness of 20 nm is approximately 6% lower.

TABLE 2

| Embedded thickness | Cgs (pF/mm) | Cgd (pF/mm) | Cds (pF/mm) | Coff (pF/mm) |
|---|---|---|---|---|
| 35 nm | 0.380 | 0.288 | 0.135 | 0.299 |
| 20 nm | 0.352 | 0.253 | 0.134 | 0.281 |

$$\text{Coff} = \frac{\text{Cgs} \cdot \text{Cgd}}{\text{Cgs} + \text{Cgd}} + \text{Cds} \quad \text{[Equation 1]}$$

Figure 14:
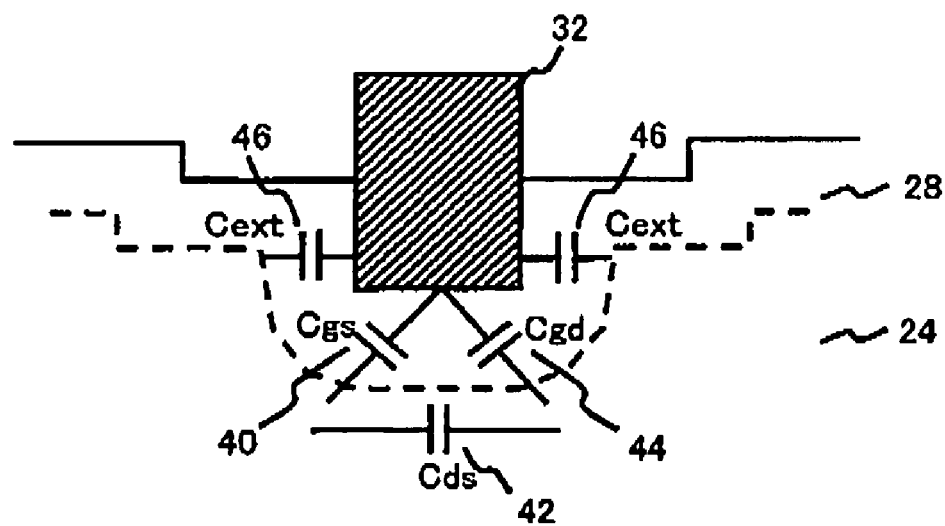
FIG. 14 is a schematic view of the vicinity of the gate electrode, illustrating the decrease in Coff in the first embodiment.

FIG. 14 is a schematic view of the gate electrode and its vicinity, illustrating the above phenomenon. In a semiconductor layer 24, a depletion layer 28 is formed on the surface and under the gate electrode 32. The capacitance between the source and the drain is Cds 42, the capacitance on the source side of the depletion layer under the gate is Cgs 40, and the capacitance on the drain side of the depletion layer under the gate is Cgd 44. Since the gate is embedded, extrinsic capacitances Cext 46 are formed at the sides of the embedded portion of the gate. With the small embedded thickness, the extrinsic capacitances Cext 46 becomes smaller, so as to reduce Coff.

As described above, in the first embodiment, Coff of each of the first-stage FETs (the FETs) 81 and 91 and the fifth-stage FETs (the third FETs) 85 and 95 can be made lower than that of each of the second- to fourth-stage FETs (the second FETs) 82, 83, 84, 92, 93, and 94.

As Coff of each of the first-stage FETs (the first FETS) 81 and 91 becomes lower, the impedance also becomes lower, thereby reducing the RF amplitude, compared with the second- to fourth-stage FETs (the second FETs) 82, 83, 84, 92, 93, and 94. Accordingly, the flow of the reverse gate current of each of the first-stage FETs (the first FETS) 81 and 91 is hindered. Thus, the harmonic components in the switch circuits can be reduced.

As described above, in the first embodiment, the first-stage FETs (the first FETs) 81 and 91 with the largest RF amplitude have high Vgdo and low Coff. With this, the harmonic components are reduced. Also, the second- to fourth-stage FETs (the second FETs) 82, 83, 84, 92, 93, and 94 have lower Ron than the first-stage FETs (the first FETs) 81 and 91. Thus, the switch circuits 80 and 90 can have lower Ron than in the case where Vgdo of all the FETs is increased and Coff of all the FETs is lowered.

In this structure, each of the first-stage FETs (the first FETs) 81 and 91 and the fifth-stage FETs (the third FETs) 85 and 95 is either a FET having higher reverse gate withstand voltage (Vgdo) than that of each of the second- to fourth-stage FETs (the second FETS) 82, 83, 84, 92, 93, and 94, or a FET having lower OFF capacitance (Coff) than that of each of the second to fourth-stage FETs (the second FETs) 82, 83, 84, 92, 93, and 94. Also, each of the second- to fourth-stage FETs (the second FETs) 82, 83, 84, 92, 93, and 94 is a FET having lower ON resistance (Ron) than that of each of the first-stage FETs (the first FETs) 81 and 91 and the fifth-stage FETs (the third FETs) 85 and 95. Thus, a semiconductor device that includes switch circuits with less harmonic components and low insertion loss can be provided.

In the first embodiment, the first-stage FETs (the first FETs) 81 and 91 have lower Coff and higher Vgdo, compared with those of the second- to fourth-stage FETs (the second FETs) 82, 83, 84, 92, 93, and 94. With the lower Coff and the higher Vgdo, the harmonic components are reduced in the first embodiment. However, it should be understood that the harmonic components can be reduced by increasing Vgdo or lowering Coff of the first-stage FETs (the first FETs) 81 and 91.

Figure 3:
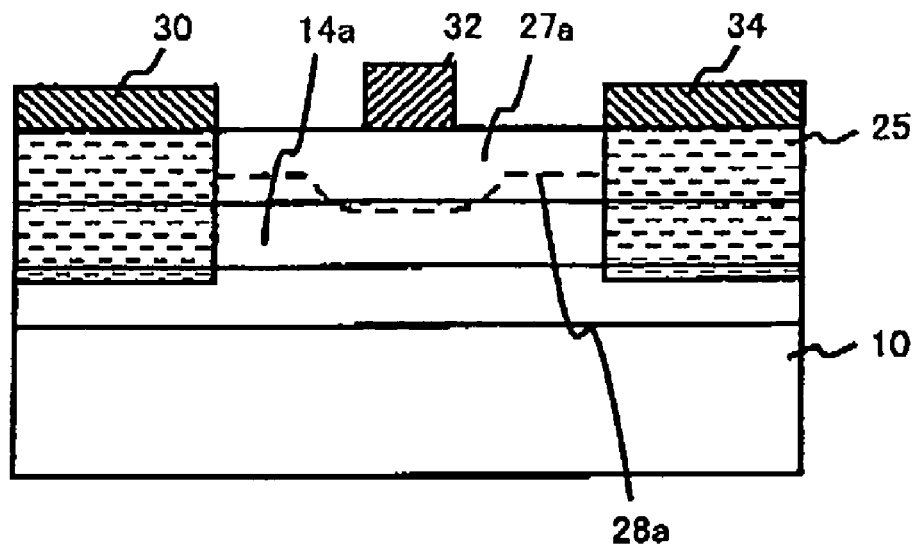
FIG. 3 is a schematic cross-sectional view of a conventional FET, illustrating a problem with the prior art.
Figure 4:
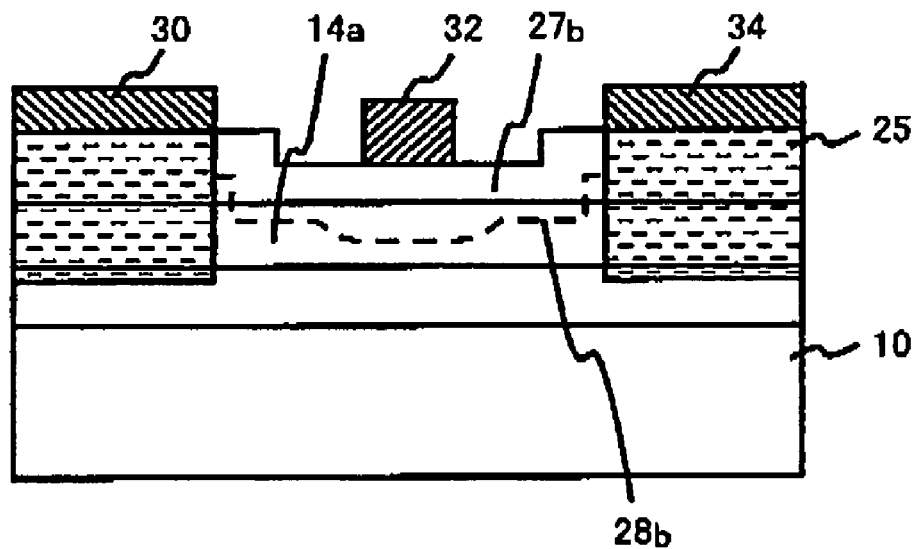
FIG. 4 is a schematic cross-sectional view of another conventional FET, illustrating a problem with the prior art.

For example, in a case where the distance between the embedded layer 20 and the channel layer 14 is short, even if Cext shown in FIG. 14 varies between the first-stage FETs (the FETs) 81 and 91 and the second- to fourth-stage FETs (the second FETs) 82, 83, 84, 92, 93, and 94, the other capacitance components are large enough, and the variation of Cext hardly affects the characteristics, because the gate electrode 32 is located close to the channel layer 14. However, as illustrated in FIGS. 3 and 4, the depth of the depletion layers 28a and 28b with respect to the channel layer 14 does affect the characteristics, and a significant difference is caused in Vgdo. As a result, the entire harmonic components are reduced.

In a case where the distance between the embedded layer 20 and the channel layer 14 is long, the depletion layers 28a and 28b do not extend sufficiently toward the channel layer 14, as illustrated in FIGS. 3 and 4. In such a case, a significant difference is not caused in Vgdo. However, the gate electrode 32 is separated from the channel layer 14, and the capacitance components below the gate electrode 32 become smaller. Accordingly, the difference in Cext shown in FIG. 14 becomes significant. As a result, the entire harmonic components are reduced after all.

Although the relationship between the first-stage FETs (the first FETs) 81 and 91 and the second- to fourth-stage FETs (the second FETs) 82, 83, 84, 92, 93, and 94 has been described above, the same relationship is of course established with the fifth-stage FETs (the third FETs) 85 and 95. The fifth-stage FETs (the third FETs) 85 and 95 may have different structures from the first-stage FETs (the first FETs) 81 and 91. For example, in the case where the first-stage FETs (the first FETs) 81 and 91 have higher Vgdo and lower Coff than those of the second- to fourth-stage FETs (the second FETS) 82, 83, 84, 92, 93, and 94, the fifth-stage FETs (the third FETs) 85 and 95 may be designed to have only high Vgdo. Here, the fifth-stage FETs (the third FETs) 85 and 95 may have low or high Coff.

In the first embodiment, the embedded thickness of each of the first-stage FETs (the first FETs) 81 and 91 and the fifth-stage FETs (the third FETs) 85 and 95 is made small, because signals with large RF amplitude are input through both the input terminal 70 and the output terminals 72 and 76. If signals with large RF amplitude are input only through the input terminal 70, only the embedded thickness of each of the first-stage FETs 81 and 91 should be made small. Alternatively, if signals with large RF amplitude are input only through the output terminals 72 and 76, only the embedded thickness of each of the fifth-stage FETs 85 and 95 should be made small.

Second Embodiment

Figure 15:
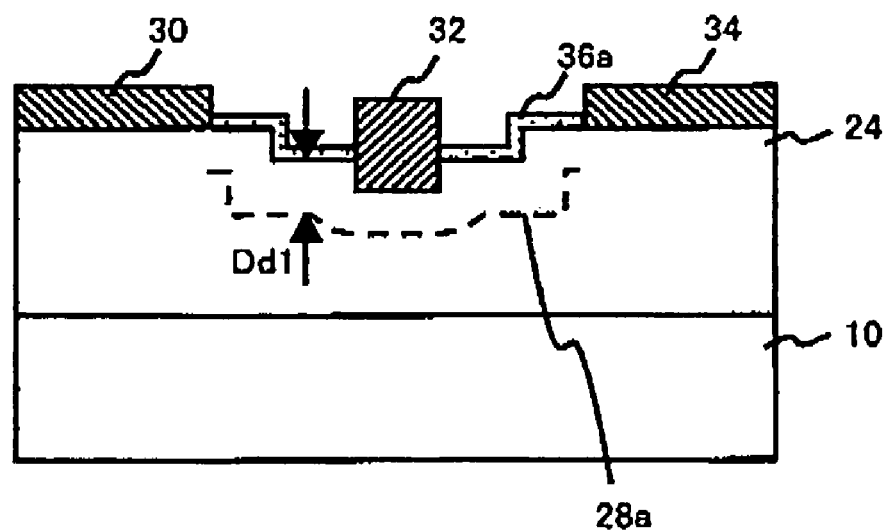
FIG. 15 is a cross-sectional view of one of the first-stage and fifth-stage FETs of a switch circuit in accordance with a second embodiment of the present invention.
Figure 16:
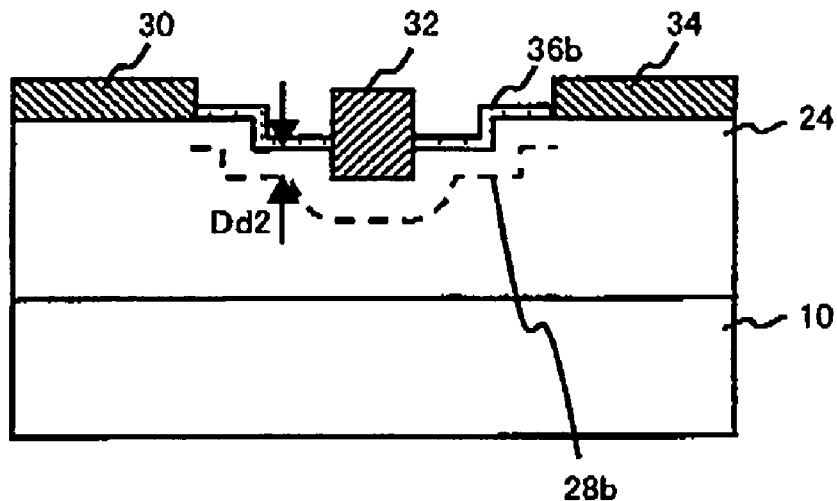
FIG. 16 is a cross-sectional view of one of the second- to fourth-stage FETs of the switch circuit in accordance with the second embodiment.

In a second embodiment of the present invention, HEMTs are also employed as FETs, and five FETs are connected in series in a SPDT. The circuit structure is the same as that of the first embodiment. FIG. 15 is a schematic cross-sectional view of the first-stage FETs (the first FETs) 81 and 91 and the fifth-stage FETs (the third FETs) 85 and 95. FIG. 16 is a schematic cross-sectional view of the second- to fourth-stage FETs (the second FETs) 82, 83, 84, 92, 93, and 94. A semiconductor layer 24 is stacked on a semiconductor substrate 10. The layers in the semiconductor layer 24 are the same as those of the first embodiment. A source electrode 30 and a drain electrode 34 are formed on the semiconductor layer 24. A gate electrode 32 is embedded in the semiconductor layer 24. A SiNx film (a first silicon nitride film) 36a or a SiNy film (a second silicon nitride film) 36b is formed as a protection film on the surface of the semiconductor layer 24 between the source electrode 30 and the gate electrode 32 and between the gate electrode 32 and the drain electrode 34.

In the following, a method of manufacturing the above described HEMT is described. First, the semiconductor layer 24 is formed on the GaAs substrate 10. The semiconductor layer 24 is formed by growing a buffer layer (not shown), an electron supply layer 12, a channel layer 14, an electron supply layer 16, a Schottky layer 18, a GaAs embedding layer 20a or 20b, and a high-concentration layer 22 by MOCVD, for example, as shown in FIGS. 7 and 8. Next, a gate recess is formed. This gate recess has such a depth as to take into account the conditions for a desired potential supplied from the gate electrode 32. However, the high-concentration layer 22 and the embedding layer 20a (the embedding layer 20b might be included) may be removed in the structure illustrated in FIGS. 7 and 8.

The SiNy film (the second silicon nitride film) 36b is then formed on the semiconductor layer 24 having the gate recess formed therein. In this case, the SiNy film 36b is formed on the entire surface of the substrate, including the FETs. Through this procedure, the SiNy film 36b is formed in the regions to be located between the gate electrode and the source electrode and between the gate electrode and the drain electrode of each of the second- to fourth-stage FETs (the second FETS) 82, 83, 84, 92, 93, and 94. Next, a mask layer made of photoresist, for example, is prepared to expose the SiNy film 36b in the regions in which the first-stage FETs (the first FETS) 81 and 91 and the fifth-stage FETs (the third FETs) 85 and 95 are to be formed, and to cover the SiNy film 36b in the regions in which the second- to fourth-stage FETs are to be formed. Using this mask layer, the exposed portions of the SiNy film 36b are removed.

The SiNx film 36a having a lower nitrogen composition ratio than that of the SiNy film 36b is then formed in the regions in which the first-stage FETs and the fifth-stage FETs are to be formed. The SiNx film 36a with the lower nitrogen composition ratio gives greater damage than the SiNy film 36b does to the semiconductor layer 24 at the time of film formation. Therefore, the SiNx film 36a is formed after the SiNy film, 36b so as to reduce the damage to the regions in which the SiNy film 36b remains. Through this procedure, the SiNx film 36a is formed in the regions to be located between the gate electrode and the source electrode and between the gate electrode and the drain electrode of each of the first-stage FETs (the first FETs) and the fifth-stage FETs (the third FETs). An opening is then formed to expose the portion of the SiNx film 36a or the SiNy film 36b at which the gate electrode 32 of each FET is to be formed, and the gate electrode 32 is formed there. Lastly, the source electrode 30 and the drain electrode 34 are formed on the high-concentration layer 22 of each FET, thereby completing each of the HEMTs illustrated in FIGS. 15 and 16.

The silicon and nitrogen compositions of the SiNx film 36a and the SiNy film 36b are different from each other, and the nitrogen composition ratio of the SiNx film 36a has a lower nitrogen composition ratio than that of the SiNy film 36b. In this structure, the nitrogen composition ratio of the SiNx film (the first silicon nitride film) 36a of each of the first-stage FETs (the first FETs) 81 and 91 and the fifth-stage FETs (the third FETs) 85 and 95 is lower than the nitrogen composition ratio of the SiNy film (the second silicon nitride film) 36b of each of the second- to fourth-stage FETs (the second FETs) 82, 83, 84, 92, 93, and 94.

Also, in FIGS. 15 and 16, the width Dd1 of the depletion layer 28a measured from the semiconductor surface is larger than the width Dd2 of the depletion layer 28b measured from the semiconductor surface, which is expressed as Dd1>Dd2. This is because the nitrogen composition ratio of the SiNx film 36a is lower than that of the SiNy film 36b. The formation of the SiNx film 36a and the SiNy film 36b can be carried out by controlling the RF frequencies, using a plasma CVD device, for example. In the second embodiment, the RF frequency for forming the SiNx film 36a is made lower than that for forming the SiNy film 36b, so that the nitrogen composition ratio of the SiNx film 36a can be made lower than that of the SiNy film 36b.

Figure 17:
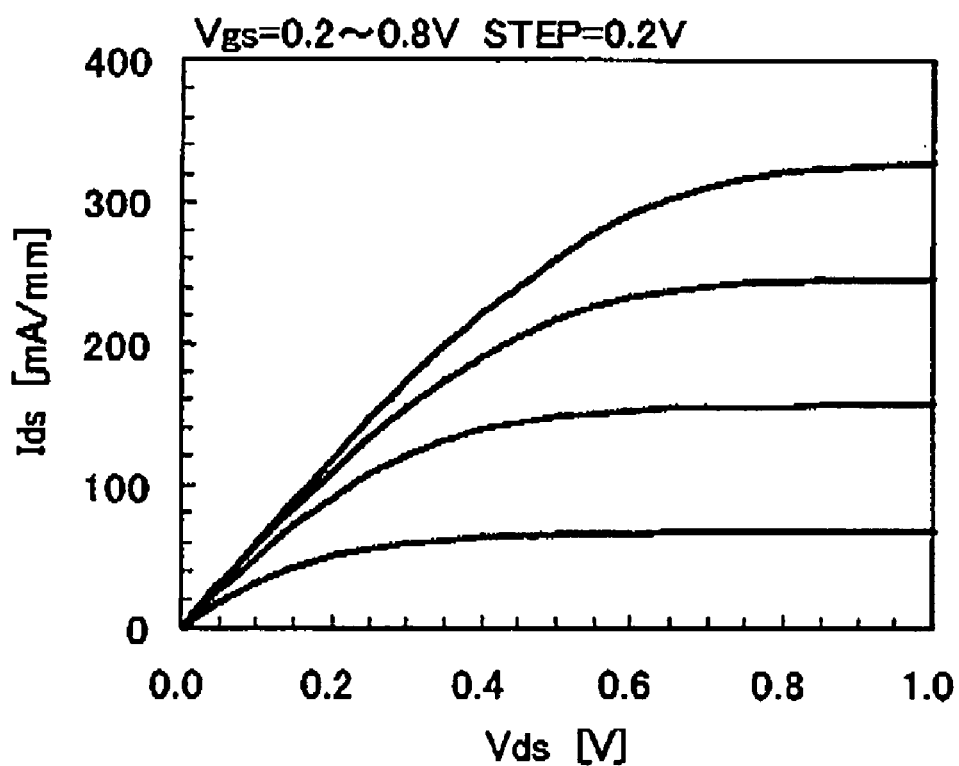
FIG. 17 shows the drain current (Ids)-drain voltage (Vds) characteristics of each of the first-stage and fifth-stage FETs (having a SiNx film) of the switch circuit in accordance with the second embodiment.
Figure 18:
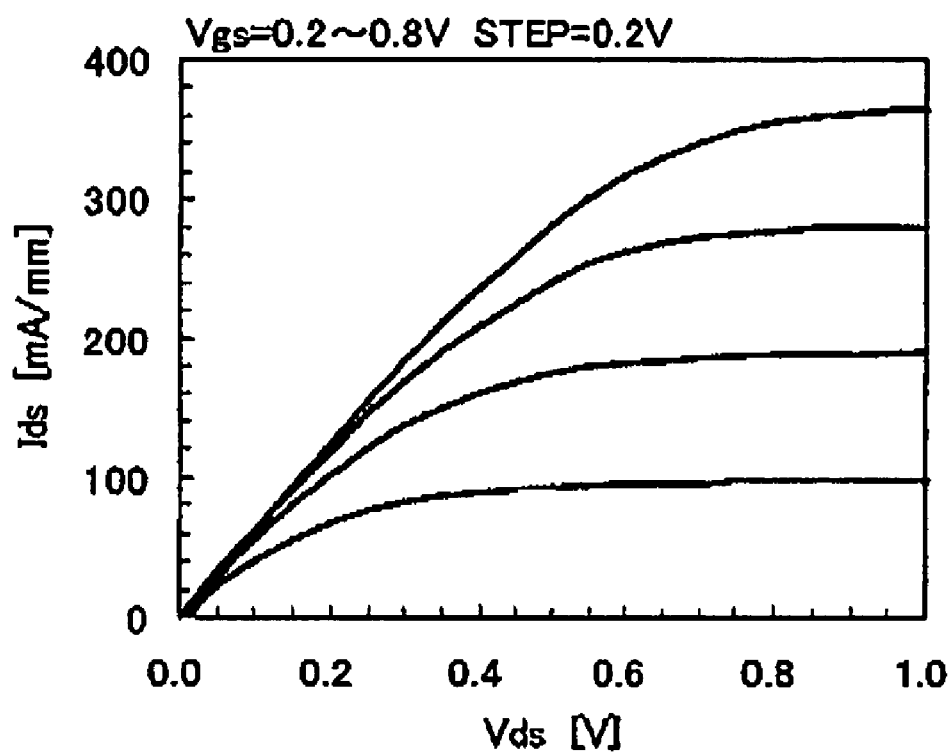
FIG. 18 shows the drain current (Ids)-drain voltage (Vds) characteristics of each of the second- to fourth-stage FETs (having a SiNy film) of the switch circuit in accordance with the second embodiment.
Figure 19:
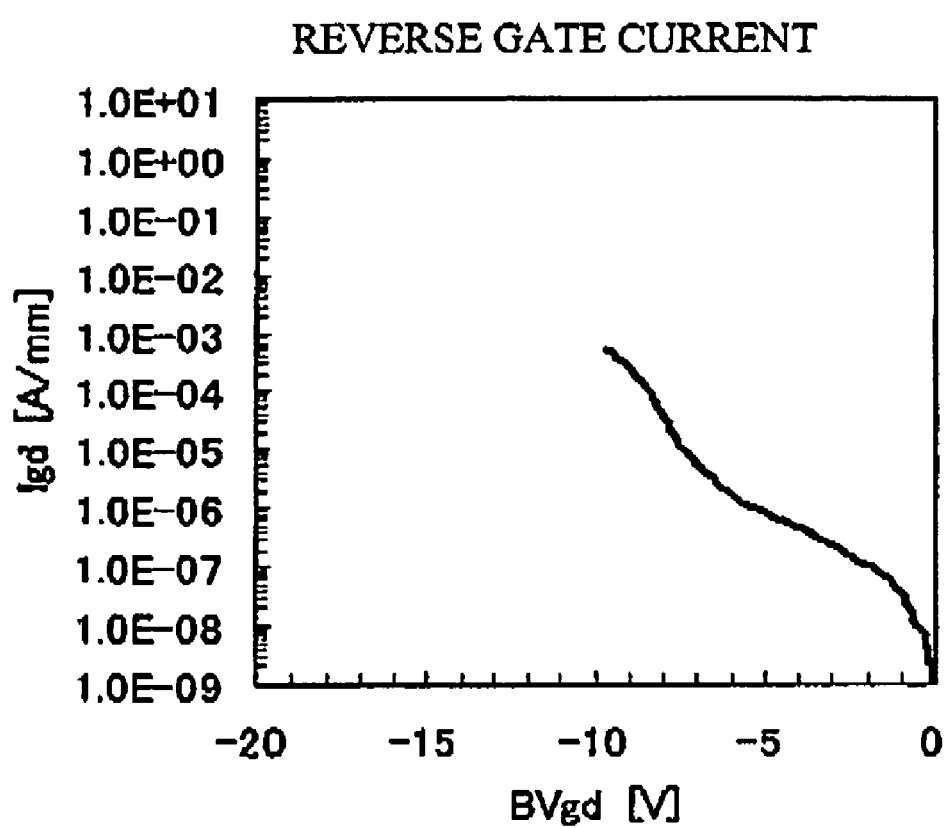
FIG. 19 shows the reverse gate current (Igd)-reverse gate voltage (BVgd) characteristics of each of the first-stage and fifth-stage FETs (having a SiNx film) of the switch circuit in accordance with the second embodiment.
Figure 20:
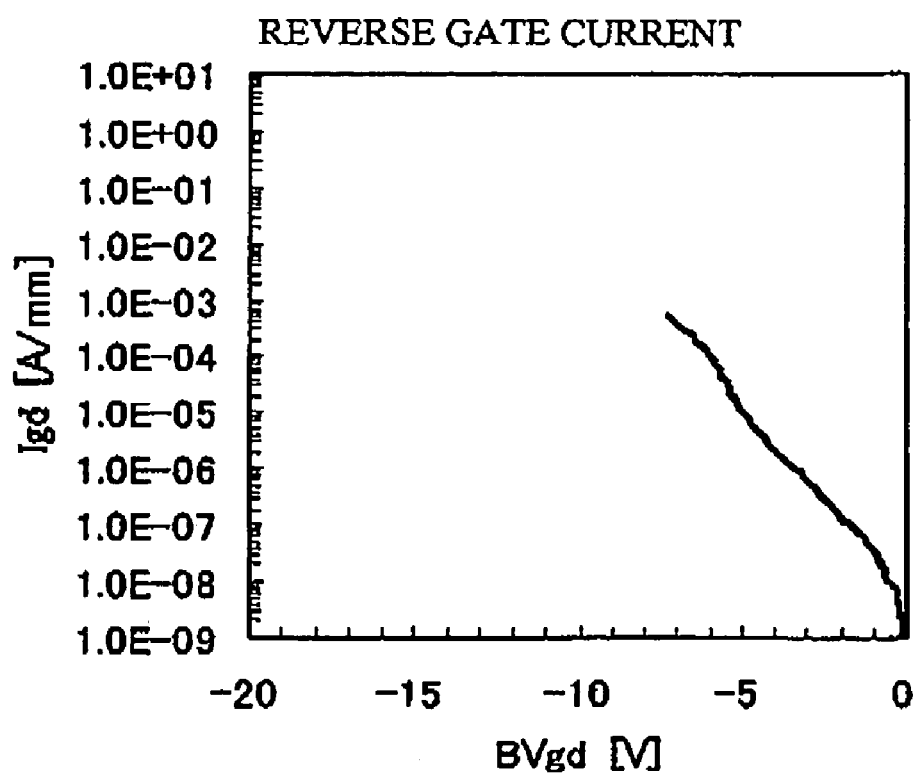
FIG. 20 shows the reverse gate current (Igd)-reverse gate voltage (BVgd) characteristics of each of the second- to fourth-stage FETs (having a SiNy film) of the switch circuit in accordance with the second embodiment.

FIGS. 17 and 18 show the drain current (Ids)-drain voltage (Vds) characteristics of FETs having a SiNx film and a SiNy film as protection films. In FIGS. 17 and 18, the slope representing the drain current Ids with respect to the drain voltage Vds of the FET having the SiNx film is gentler than the slope representing the drain current Ids with respect to the drain voltage Vds of the FET having the SiNy film. FIGS. 19 and 20 show the reverse gate current (Igd)-reverse gate voltage (BVgd) characteristics of the FET having the SiNx film as a protection film and the FET having the SiNy film as a protection film, respectively. The reverse gate current of the FET having the SiNx film is lower than that of the FET having the SiNy film.

Table 3 shows Ron and Vgdo per 1 mm in gate width of each of the FETs having the SiNx film and the SiNy film as protection films. In the FET having the SiNx film, Ron is 1.81 Ωmm, which is smaller than Ron of 1.76 Ωmm in the FET having the SiNy film. In the FET having the SiNx film, Vgdo is −9.6 V, which is better than Vgdo of −7.3 V in the FET having the SiNy film.

TABLE 3

| Protection film | Ron (Ω mm) | Vgdo (V) |
|---|---|---|
| SiNx film | 1.81 | −9.6 |
| SiNy film | 1.76 | −7.3 |

Since the SiNx film is used in each of the first-stage FETs (the first FETs) 81 and 91 that exhibit larger RF amplitude than the other FETs, the variation in reverse gate current can be made smaller, as in the first embodiment. Thus, excellent power durability can be obtained even if a signal with large RF amplitude is input.

In the second embodiment, Ron of the entire switch circuit (1) with a gate width of 2.4 mm is calculated to find the following: 1.76 Ωmm/2.8 mm×3+1.81 Ωmm/2.8 mm×2=3.18 Ω. In the case where all the five-stage FETs have a SiNy film, the following is obtained: 1.76 Ωmm/2.8 mm×5=3.14 Ω.

In the second embodiment, a SiNx film is employed in each of the first-stage FETs (the first FETs) and the fifth-stage FETs (the third FETs), so that the Ron increase is restricted to approximately 1.3%, which is smaller than the Ron increase of approximately 5% in the first embodiment. Thus, the increase in insertion loss can be made smaller than in the first embodiment.

Table 4 shows Cgs, Cgd, Cds, and Coff of FETs having a SiNx film and a SiNy film as protection films. Here, each capacitance is calculated in the same manner as in the first embodiment. As shown in Table 4, Coff of the FET having the SiNx film is 0.299 pF/mm, which is smaller than Coff of 0.304 pF/mm in the FET having the SiNy film. Accordingly, Coff of the FET having the SiNx film is approximately 2% lower. This is because the width Dd1 of the surface depletion layer can be made smaller by virtue of the use of the SiNx film. As the capacitance of each of the first-stage FETs (the first FETs) 81 and 91 can be made small, the harmonic components in the switch circuit can be reduced as in the first embodiment, compared with the case where a SiNy film is used in all the FETs.

TABLE 4

| Protection film | Cgs (pF/mm) | Cgd (pF/mm) | Cds (pF/mm) | Coff (pF/mm) |
|---|---|---|---|---|
| SiNx film | 0.380 | 0.288 | 0.135 | 0.299 |
| SiNy film | 0.389 | 0.300 | 0.135 | 0.304 |

As described above, in the second embodiment, the Ron increase in each switch circuit can be restrained, while Vgdo is increased and Coff is reduced. Thus, the harmonic components can be reduced while the insertion loss is restrained.

Third Embodiment

Figure 21:
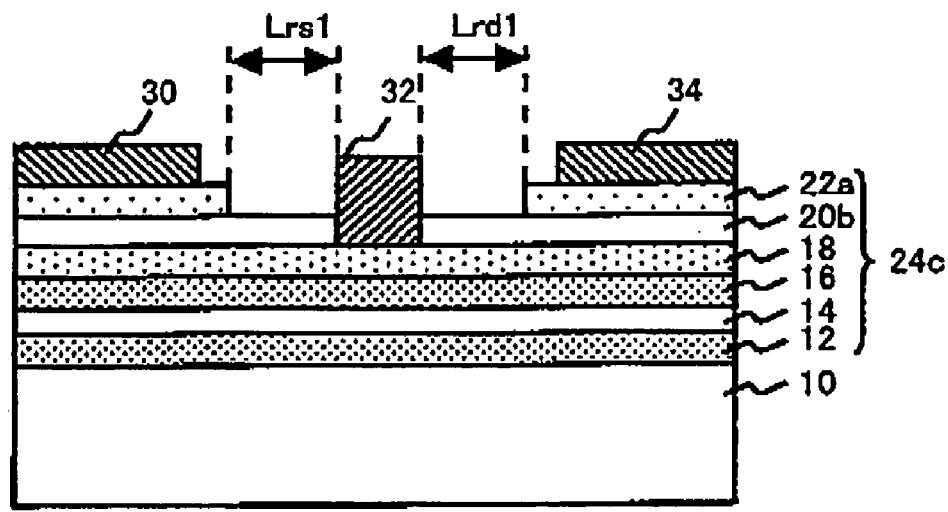
FIG. 21 is a cross-sectional view of one of the first-stage and fifth-stage FETs of a switch circuit in accordance with a third embodiment of the present invention.
Figure 22:
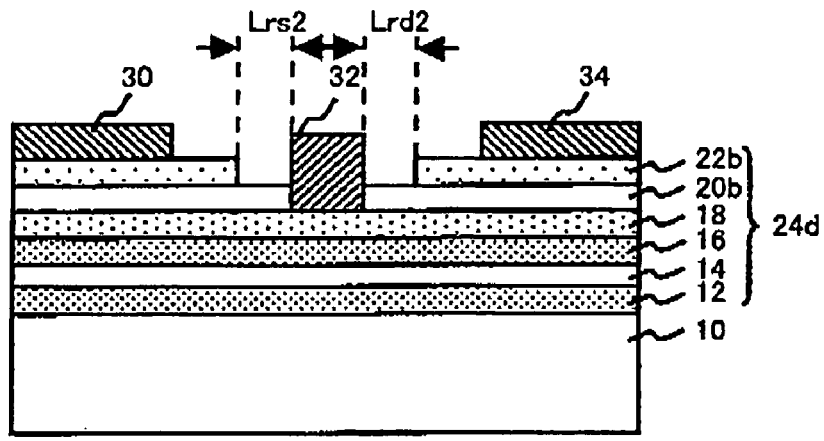
FIG. 22 is a cross-sectional view of one of the second- to fourth-stage FETs of the switch circuit in accordance with the third embodiment.

In a third embodiment of the present invention, HEMTs are also employed as FETs, and five FETs are connected in series in each SPDT. The circuit structure is the same as that of the first embodiment. FIG. 21 is a schematic cross-sectional view of the first-stage FETs (the first FETs) 81 and 91 and the fifth-stage FETs (the third FETs) 85 and 95. FIG. 22 is a schematic cross-sectional view of the second- to fourth-stage FETs (the second FETs) 82, 83, 84, 92, 93, and 94. Each FET has a gate electrode formed in a gate recess. The structure of this embodiment is the same as the structure illustrated in FIG. 8, except for the gate recess width. Here, the "gate recess width" is the distance between the gate electrode 32 and a high-concentration layer 22a or 22b.

The gate recess width on the source side in each of the first-stage FETs (the first FETs) and the fifth-stage FETs (the third FETS) is represented by Lrs1, and the gate recess width on the drain side is Lrd1. The gate recess widths on the source side and on the drain side in each of the second- to fourth-stage FETs (the second FETs) are represented by Lrs2 and Lrd2, respectively. In the third embodiment, Lrs1 is larger than Lrs2, and Lrd1 is larger than Lrd2. Also, Lrs1 and Lrd1 are both 0.5 μm, and Lrs2 and Lrd2 are both 0.3 μm. Accordingly, the gate recess width in each of the first-stage FETs (the first FETs) 81 and 91 and the fifth-stage FETs (the third FETs) 85 and 95 is larger than the gate recess width in each of the second- to fourth-stage FETs (the second FETs) 82, 83, 84, 92, 93, and 94.

In each of the first-stage and fifth-stage FETS, the distance between the gate electrode and the $n^+$-type high-concentration layer can be made long, so as to increase Vgdo, though Ron also becomes higher. Also, Coff can be reduced, though not as much as in the first and second embodiments. Accordingly, Vgdo can also be increased while the Ron increase in each switch circuit is restrained in the third embodiment. Thus, the harmonic components can be reduced while the insertion loss is restrained.

Although Lrs1 is equal to Lrd1 and Lrs2 is equal to Lrd2 in the third embodiment, Lrs1 and Lrs2 may not be equal to Lrd1 and Lrd2, respectively, as long as the following relationship is maintained; Lrs1>Lrs2, Lrd1>Lrd2.

In the third embodiment, both Vgdo and Coff of each of the first-stage FETs (the first FETs) 81 and 91 and the fifth-stage FETs (the third FETs) 85 and 95 differ from those of each of the second- to fourth-stage FETs (the second FETs) 82, 83, 84, 92, 93, and 94. However, only either Vgdo or Coff of each of the first-stage FETs (the first FETs) 81 and 91 and the fifth-stage FETs (the third FETs) 85 and 95 may differ from that of each of the second- to fourth-stage FETs (the second FETs) 82, 83, 84, 92, 93, and 94.

For example, even in a case where the recess width of each of the first-stage FETs (the first FETs) 81 and 91 and the fifth-stage FETs (the third FETs) 85 and 95 is made different from that of each of the second- to fourth-stage FETs (the second FETS) 82, 83, 84, 92, 93, and 94, the source-drain capacitance (Cgs) becomes smaller if the gate recess width is sufficiently large for each FET. Accordingly, Coff becomes substantially the same among all the FETs, and the difference in Vgdo causes a crucial difference in effect.

In a case where the gate recess width is relatively small in each FET, the source-drain capacitance becomes larger, and the difference in Coff causes a more crucial difference in effect than the difference in Vgdo.

Although HEMTs are employed as FETs in each of the first through third embodiments, it is possible to employ other FETs such as MESFETs (Metal Semiconductor Field Effect Transistors). Also, five FETs are connected in series in each SPDT in the first through third embodiments. However, the present invention may be implemented in more complicated RF switches, such as SP3T, SP4T, SP5T, SP6T, SP7T, or SP8T. In the first through third embodiments, the number of stages of FET series connection is five. However, the number of stages may be two or more in a case where signals with large RF amplitude are input only through either the input terminal or the output terminal. In a case where signals with large RF amplitude are input through both the input terminal and the output terminal, the number of stages should be three or more.

Fourth Embodiment

Figure 23:
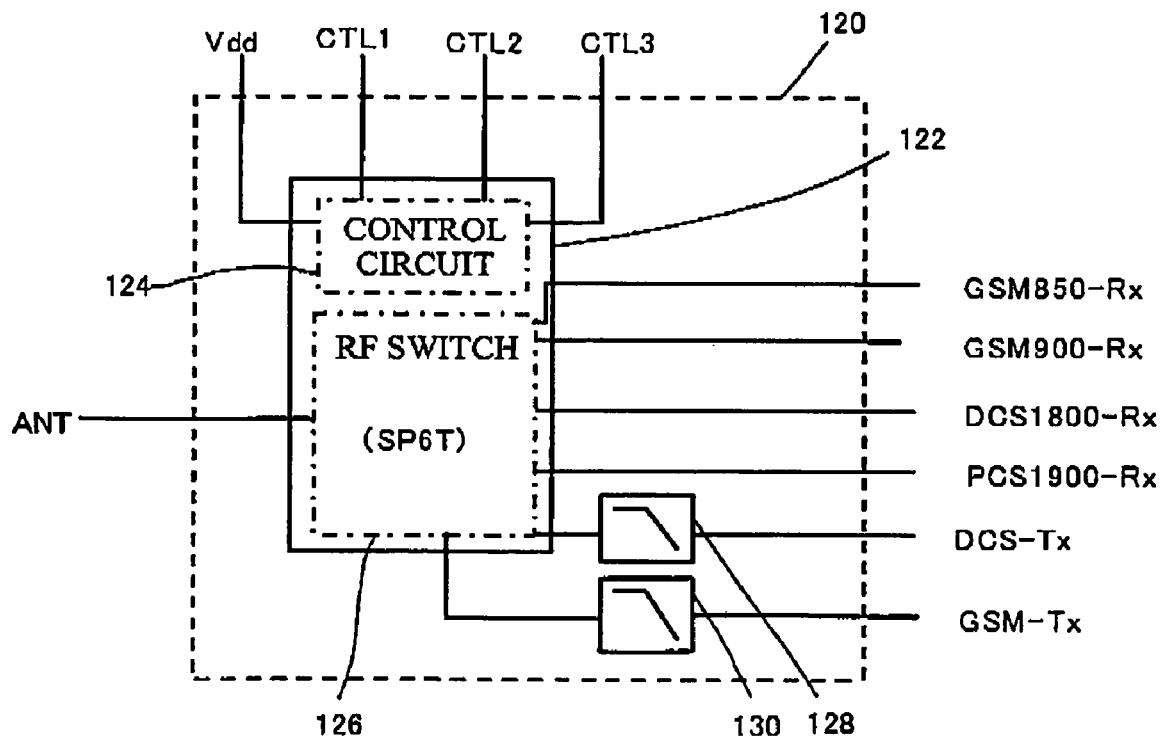
FIG. 23 is a block diagram of a RF antenna switch module to be used in a portable telephone terminal device in accordance with a fourth embodiment of the present invention.

A fourth embodiment of the present invention is a RF antenna switch module (a RF module) that is used in a portable telephone terminal device. FIG. 23 is a block diagram of a semiconductor device in accordance with the fourth embodiment of the present invention. The RF module 120 has the function of switching between an antenna ANT and RF signaling systems. The RF module 120 includes a semiconductor chip 122 and low-pass filters (LPFs) 128 and 130. The semiconductor chip 122 includes a control circuit 124 and a RF switch 126. The RF switch 126 has the functions of a so-called SP6T, and includes the switch circuit of one of the first through third embodiments.

The RF switch 126 shown in FIG. 23 selectively connects the six RF signaling systems of GSM850-Rx, GSM900-Rx, DCS1800-Rx, PCS1900-Rx, DCS-Tx, and GSM-Tx to the antenna ANT. The LPFs 128 and 130 are provided on the signaling systems DCS-Tx and GSM-Tx, respectively. In accordance with control signals CTL1 through CTL 3 supplied from the outside, the control circuit 124 controls the switching of the switch circuit through each switch circuit control terminal in the RF switch 126. A supply voltage Vdd is applied to the semiconductor chip 122. In the fourth embodiment, a RF module with less harmonic components and lower insertion loss can be provided.

The switch circuit may further include a third FET that is connected to the other one of the input terminal and the output terminal, and is energized or unenergized under the control of a gate electrode connected to the control terminal, the third FET having a higher reverse gate withstand voltage or lower OFF capacitance than that of the second FET. In accordance with the present invention, even if a signal with large RF amplitude is input through both the input terminal and the output terminal in a switch terminal, harmonic components can be reduced.

In the switch circuit, a plurality of second FETs may be connected in series between the first FET and the other one of the input terminal and the output terminal. In accordance with the present invention, even with a switch circuit having a large number of FET stages, harmonic components can be reduced.

In the switch circuit, the control terminal may be grounded to perform the unenergizing. In accordance with the present invention, harmonic components can be reduced in a switch circuit in which unenergizing is performed by grounding the control terminal.

In the semiconductor device, the first FET and the second FET may be HEMTs each having electron supply layers and a channel layer. In accordance with the present invention, a semiconductor device with excellent low-noise characteristics can be provided.

In the semiconductor device, the electron supply layers may be provided on and below the channel layer. In accordance with the present invention, a semiconductor device that can maintain a higher drain current can be provided.

In the semiconductor device, the first FET and the second FET may be formed with GaAs-based compound semiconductors. In accordance with the present invention, a semiconductor device that includes a GaAs-based compound semiconductor and has less harmonic components can be provided.

In the above-described method, the first FET and the second FET may be HEMTs each having electron supply layers and a channel layer. In accordance with the present invention, a method of manufacturing a semiconductor device with excellent low-noise characteristics can be provided.

In the above-described method, the electron supply layers may be provided on and below the channel layer. In accordance with the present invention, a method of manufacturing a semiconductor device that can maintain a higher drain current can be provided.

In the above-described method, the first FET and the second FET may be formed with GaAs-based compound semiconductors. In accordance with the present invention, a method of manufacturing a semiconductor device that includes a GaAs-based compound semiconductor and has less harmonic components can be provided.

Although a few preferred embodiments of the present invention have been shown and described, it would be appreciated by those skilled in the art that changes may be made in these embodiments without departing from the principles and spirit of the invention, the scope of which is defined in the claims and their equivalents.

The present invention is based on Japanese Patent Application No. 2005-096903 filed on Mar. 30, 2005, the entire disclosure of which is hereby incorporated by reference.

What is claimed is:

1. A switch circuit comprising:
 a source electrode or a drain electrode of a first FET being connected to either an input terminal or an output terminal, said first FET performs ON/OFF operation under the control of a gate electrode connected to a control terminal; and
 a source electrode or a drain electrode of a second FET being connected to the input terminal or the output terminal, whichever is not connected to the source electrode or the drain electrode of the first FET, and the source electrode or the drain electrode of the second FET being connected to the source electrode or the drain electrode of the first FET, whichever is not connected to the input terminal, said second FET performs ON/OFF operation under the control of a gate electrode connected to the control terminal, wherein:
 a part of the gate electrode is embedded in an embedding layer in each of the first FET and the second FET, an embedded thickness of the part of the gate electrode embedded in the embedding layer of the first FET is smaller than an embedded thickness of the part of the gate electrode embedded in the embedding layer of the second FET so that the first FET has a higher gate backward breakdown voltage than that of the second FET;
 the embedding layer at which the gate electrode of the first FET is formed has a concave portion and the embedding layer at which the gate electrode of the second FET does not have any concave portions so that the embedded thickness of the part of the gate electrode embedded in the embedding layer of the first FET is smaller than the embedded thickness of the part of the gate electrode embedded in the embedding layer of the second FET.

2. A switch circuit comprising:
 a source electrode or a drain electrode of a first FET being connected to either an input terminal or an output terminal, said first FET performs ON/OFF operation under the control of a gate electrode connected to a control terminal; and
 a source electrode or a drain electrode of a second FET being connected to the input terminal or the output terminal, whichever is not connected to the source electrode or the drain electrode of the first FET, and the source electrode or the drain electrode of the second FET being connected to the source electrode or the drain electrode of the first FET, whichever is not connected to the input terminal, said second FET performs ON/OFF operation under the control of a gate electrode connected to the control terminal,
 wherein:
 a part of the gate electrode is embedded in an embedding layer in each of the first FET and the second FET, an embedded thickness of the part of the gate electrode embedded in the embedding layer of the first FET is smaller than an embedded thickness of the part of the gate electrode embedded in the embedding layer of the second FET so that the first FET has lower OFF capacitance than that of the second FET;
 the embedding layer at which the gate electrode of the first FET is formed has a concave portion and the embedding layer at which the gate electrode of the second FET does not have any concave portions so that the embedded thickness of the part of the gate electrode embedded in the embedding layer of the first FET is smaller than the embedded thickness of the part of the gate electrode embedded in the embedding layer of the second FET.

3. The switch circuit as claimed in claim 1, further comprising
 a source electrode or a drain electrode of a third FET being connected to the input terminal or the output terminal, whichever is not connected to the source electrode or the drain electrode of the first FET, and the source electrode or the drain electrode of the third FET being connected to the source electrode or the drain electrode of the second FET, whichever is not connected to the first FET, said third FET performs ON/OFF operation under the control of a gate electrode connected to the control terminal,
 the third FET having a higher gate backward breakdown voltage or lower OFF capacitance than that of the second FET.

4. The switch circuit as claimed in claim 3, wherein a plurality of second FETs are connected in series between the first FET and the third FET.

* * * * *